United States Patent [19]

Dagher

[11] Patent Number: 5,553,097
[45] Date of Patent: Sep. 3, 1996

[54] SYSTEM AND METHOD FOR TRANSPORTING HIGH-BANDWIDTH SIGNALS OVER ELECTRICALLY CONDUCTING TRANSMISSION LINES

[75] Inventor: Jerry Dagher, Raleigh, N.C.

[73] Assignee: International Business Machines Corporation, Armonk, N.Y.

[21] Appl. No.: 252,034

[22] Filed: Jun. 1, 1994

[51] Int. Cl.$^6$ .................................................. H04B 1/66
[52] U.S. Cl. .................. 375/240; 375/257; 375/260; 333/129; 348/388; 370/21; 370/85.9
[58] Field of Search ............................ 375/211, 240, 375/257, 260, 377; 370/19, 21, 69.1, 85.9, 109, 112, 113; 333/1, 1.1, 124, 129; 348/384, 388, 390, 438

[56] References Cited

U.S. PATENT DOCUMENTS

| | | | |
|---|---|---|---|
| 4,980,897 | 12/1990 | Decker et al. | 375/260 |
| 5,119,402 | 6/1992 | Ginzburg et al. | 375/260 |
| 5,206,611 | 4/1993 | Russell | 333/127 |
| 5,408,473 | 4/1995 | Hutchison et al. | 375/260 |

OTHER PUBLICATIONS

"FDDI-Compatible Copper Media LAN Adapter," *IBM Technical Disclosure Bulletin*, vol. 32, No. 6A, Nov. 1989.
"Digital Signal Processing for High Speed Digital Transport Technology in the Copper Loop Plant," T. R. Hsing and J. W. Lechleider, IEEE Global Telecommunications Conference, GLOBECOM '91.
"Data on the Fast Track," J. Bech and G. Merz, Telecom Rep. Int. (Germany), vol. 14, No. 3, May Jun. 1991.
"The Search for a Reasonably Priced Approach." FDDI with Copper Cables in Place of Glass Fibres May Become More Economical. B. Reder, *Elektronik* (Germany), vol. 41, No. 19, Sep. 15, 1992.
"A Water Distribution Control System Delivered to Osaha Prefecture," H. Yoshihara, Y. Osuga, T. Nonaka, T. Goto. *Mitsubishi Denki Giho* (Japan) vol. 65, No. 11, 1991, pp. 66–72.
"34 Mbit/s Line Equipment for Digital Transmission Over Coaxial and Lightwave Cables," T. Aepli, J. Fluhr, P. Marending, *Technische Mitteilung en PTT*, vol. 64, No. 9, pp. 418–430.

Primary Examiner—Stephen Chin
Assistant Examiner—Don Vo
Attorney, Agent, or Firm—Stephen T. Keohane; Kelly K. Kordzik

[57] ABSTRACT

A system and method for decreasing the amount of bandwidth required to transmit a high bandwidth signal over electrically conducting transmission lines, wherein the transmission lines are arranged in a symmetrical configuration so that their propagation characteristics permit frequency independent modes of propagation of a plurality of signals to be transmitted thereon. This permits decomposing a high bandwidth signal into lower bandwidth signals, and then encoding these lower bandwidth signals in association with the frequency independent modes of propagation, driving the individual electrically conducting transmission lines with these encoded signals, and then decoding and recombining the signals at the receiving end to recapture the high bandwidth signal.

27 Claims, 8 Drawing Sheets

SYSTEM AND METHOD FOR TRANSPORTING HIGH-BANDWIDTH SIGNALS OVER ELECTRICALLY CONDUCTING TRANSMISSION LINES

TECHNICAL FIELD OF THE INVENTION

This invention relates to the transmission of signals and more particularly to a system and method for transporting high-bandwidth data signals over electrically conducting transmission lines.

BACKGROUND OF THE INVENTION

Though it is quite evident that fiber optic transmission systems are the "wave of the future" with respect to voice and data communications, present day communications must still deal with electrical conductors, since these comprise the majority of the communications highway. Of course, the problem with electrical conductors is their limited bandwidth capabilities. Because the need for fast and reliable information is an ever increasing commodity, communications lines are increasingly required to carry more and more information, i.e., the required data rates are ever increasing. Fiber optic cables are well adapted for these high data rates; however, the existing physical plants of essentially copper wires is not up to the task. This dilemma is made ever more burdensome by the fact that replacement of electrical conductors with fiber optic cables is both laborious and expensive, while also requiring replacement of the associated transmitting and receiving terminal devices.

In response to the aforementioned problems, several prior solutions have focused on transmitting data at FDDI (fiber distributed-data interface) and ATM (asynchronous transfer mode) data rates on existing media such as shielded twisted pair. This emphasis has been on coding schemes that reduce the signal bandwidth to meet FCC emissions requirements. Such schemes include QPRIV-IV (please refer to *Quaternary Partial-Response Class-IV Systems for 125 Mbit/s Data Transmission Over Unshielded Twisted-Pair Cables*, G. Cherubini, S. Olcer, G. Ungerboeck, Proceedings of the IEEE International Conference on Communications 1993, p. 1814–1819) and CAP-32 (please refer to *Bandwidth-Efficient Digital Transmission up to 155 Mb/s Over Unshielded Twisted-Pair Wiring*", Gi-Hong Im, J. J. Werner, Proceedings of the IEEE International Conference on Communications 1993, p. 1797–1803), which meet the technical criteria of reducing the bandwidth of the high-speed data signals and maintaining a good link error rate performance, but are costly and require complex circuitry (e.g., very large scale integration ("VLSI") circuitry) in their implementation.

Accordingly, there is a need in the art for a less expensive and simpler system and method for decreasing the amount of bandwidth required to transmit high bandwidth signals over electrically conducting transmission lines.

SUMMARY OF THE INVENTION

Thus, it is a primary object of the present invention to provide a system and method for decreasing the amount of bandwidth required to transmit a high bandwidth signal over electrically conducting transmission lines without requiring a complex coding scheme or circuitry.

In the attainment of the above object, the present invention utilizes a multiconductor transmission line meeting certain symmetry conditions. Because of these symmetry conditions, the multiconductor transmission line exhibits a certain set of propagation characteristics, which provide for propagation of frequency independent transmission modes when driven by the appropriate set of signals. As a result, a high bandwidth signal may be decomposed into lower bandwidth signals that are then manipulated with selected parameters and used to drive the various conductors within the multiconductor transmission line. At the receiving end, the encoded low bandwidth signals are then recombined, or multiplexed, into the original high bandwidth signal.

In a preferred embodiment of the present invention, the multiconductor transmission line consists of N identical signal conductors with identical insulation (both in thickness and dielectric constant) enclosed by a ground shield. The conductors are arranged in cyclic symmetry with each other so that their impedance and admittance characteristics permit the transmission of signals using frequency independent modes of propagation so that modal identity is maintained from driver to receiver.

In an alternative embodiment of the present invention, the multiconductor transmission line is comprised of parallel bus lines of equal distance from each other and all lying in a plane above a ground plane. Such an arrangement of bus lines exhibits similar symmetrical propagation characteristics, which permit frequency independent propagation modes.

The physical arrangement of either of the above embodiments of the multiconductor transmission line results in a propagation matrix that is the square root of the multiplication of the impedance and admittance matrices associated with the transmission line, and which may be diagonalized so that eigenvalues may be computed, which are the propagation constants of the desired frequency independent transmission modes. From these eigenvalues, eigenvectors can be computed and then used to drive the various conductors of the transmission line, thereby propagating modes which remain orthogonal, or decoupled, at every frequency. In other words, the "modes" (or eigenvalues) are properties that belong to the transmission line. These modes are "excited" by an appropriate set (vector) of signals (eigenvectors) that drive the line.

Thus, a high bandwidth signal may be decomposed into lower bandwidth signals, which are then encoded with the aforementioned eigenvectors into signals that excite frequency independent modes of propagation. These encoded signals are then transmitted over the various conductors within the transmission line; and at the receiving end, the transported lower bandwidth signals may then be recombined into the original high bandwidth signal. The frequency independent modes of propagation permit transmission of the various lower bandwidth signals over the transmission line as a result of the cyclic symmetry of the conductors within the transmission line and the manipulation of the signals using the eigenvectors associated with the propagation characteristics of the symmetrically aligned conductors.

The foregoing has outlined rather broadly the features and technical advantages of the present invention in order that the detailed description of the invention that follows may be better understood. Additional features and advantages of the invention will be described hereinafter which form the subject of the claims of the invention.

BRIEF DESCRIPTION OF THE DRAWING

For a more complete understanding of the present invention, and the advantages thereof, reference is now made to the following descriptions taken in conjunction with the accompanying drawings, in which.

DETAILED DESCRIPTION OF A PREFERRED EMBODIMENT OF THE INVENTION

Figure 1:
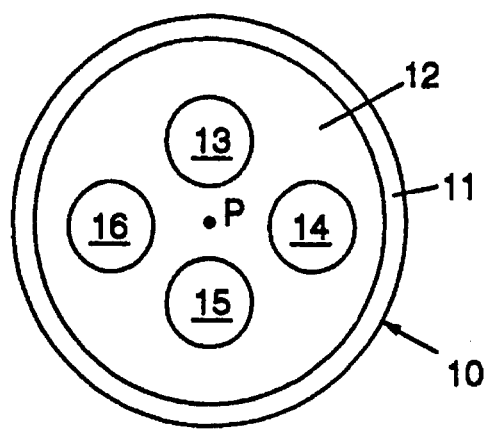
FIG. 1 illustrates a transmission line exhibiting cyclic symmetry.

The present invention discloses a system and method of decreasing the amount of bandwidth required to transmit a signal, such as a data signal, over electrically conducting transmission lines, e.g., copper shielded twisted pair. The following discussion is general enough to apply to any multiconductor system meeting the symmetry conditions to be discussed below. Without loss of such a generality, the following implementation of the bandwidth reduction technique is discussed with reference to an n=4 transmission line. Such a transmission line shall consist of n identical signal conductors with identical insulation (both in thickness and dielectric constant) enclosed by a ground shield. Referring to FIG. 1, there is illustrated multiconductor transmission line 10 having 4 identical signal conductors 13–16 enclosed by ground shield 11. Transmission line 10 is a typical transmission line well known in the art.

Known as cyclic symmetry, the centers of conductors 13–16 are equidistant from each other and lie on a circle whose center P is also the center of outer shield 11.

Note, that often with respect to transmission lines having cyclic symmetry, filler material 12 may be allowed to have a different dielectric constant than the individual insulators surrounding conductors 13–16. However, for the following implementation, it is required that filler 12 be materially identical to the insulation material surrounding conductors 13–16 to insure that all n propagation modes (to be discussed below) have identical propagation constants.

Figure 2:
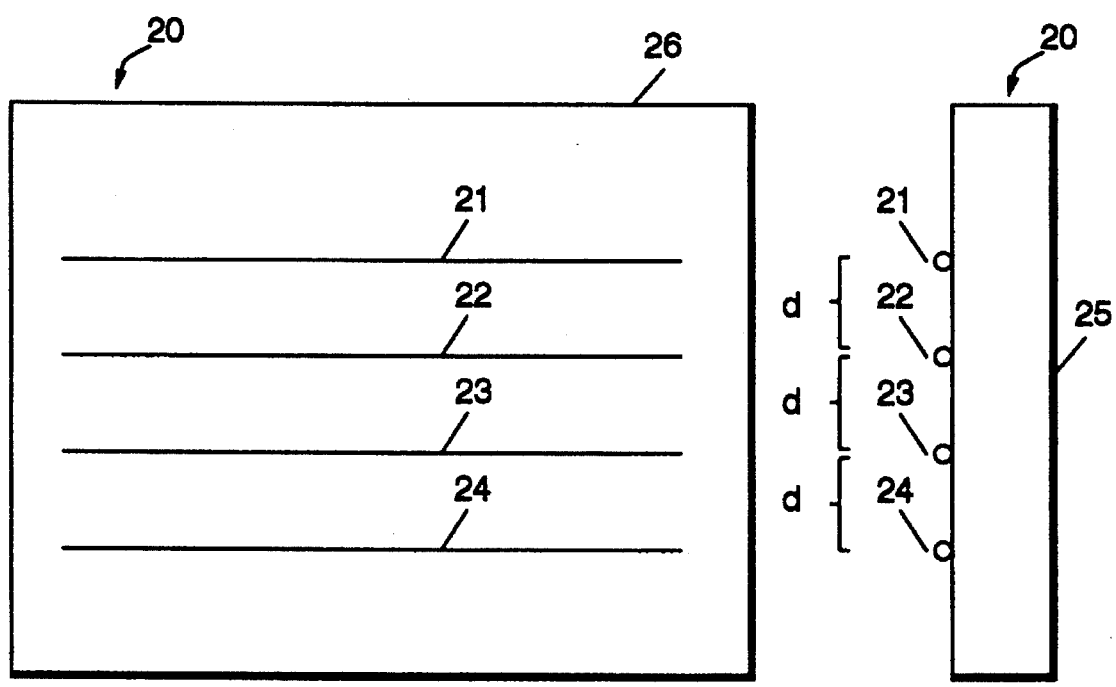
FIG. 2 illustrates an alternative embodiment of a transmission line exhibiting symmetry characteristics similar to the transmission line illustrated in FIG. 1.

Referring next to FIG. 2, there is illustrated an alternative embodiment of the multiconductor transmission line utilized within the implementation of the present invention. In this instance, multiconductor transmission line 20 is comprised of parallel bus lines 21–24 etched upon printed circuit board 26. Printed circuit board 26 also includes ground plane 25. Note that the distances d between each of bus lines 21–24 are of equal distance from each other so as to produce the symmetry required for the present invention as discussed below. Because of the particular characteristics of printed circuit board manufacturing, board 26 is composed of one material, thus fulfilling the above discussed requirement that the insulation between conductors 21–24 with respect to each other and with respect to ground plane 25 results in equal dielectric constants.

The remainder of the discussion will be solely in reference to transmission line 10, but may also apply to transmission line 20.

In the frequency domain, the transmission equations for multiconductor transmission line 10 are:

$$\frac{dV(x)}{dx} = -Z\,I(x)$$

$$\frac{dI(x)}{dx} = -Y\,V(x)$$

where V(x) and I(x) are n×1 voltage and current vectors and Z and Y are n×n impedance and admittance matrices representing the propagation characteristics of transmission line 10. The propagation matrix $\Gamma$ associated with these impedance and admittance matrices is the square root of the product of Z and Y:

$$\Gamma = \sqrt{ZY}$$

Due to cyclic symmetry, a frequency independent transformation matrix T exists that diagonalizes $\Gamma$ such that $$T^{-1}\Gamma T = \gamma$$

T is known as the eigenvector matrix, and its normalized elements are $$T_{rc} = \frac{1}{\sqrt{n}}\, e^{j\frac{2\pi}{n}(r-1)(c-1)}$$

The diagonal elements of $\gamma$ are the eigenvalues of the propagation matrix $\Gamma$, which are the propagation constants of the n transmission modes of transmission line 10. By restricting filler material 12 to be the same material as the insulation dielectric, it is insured that all n propagation modes associated with the propagation matrix $\Gamma$ are identical. The columns of T, $E_i$ (i=1,2, . . . n), are the eigenvectors of the propagation matrix $\Gamma$. The eigenvectors have a practical significance: by driving conductors 13–16 of transmission line 10 with a set of generator voltages relative to ground equal to Real $\{e^{-j\omega t}E_i\}$, a single propagation mode corresponding to the $i^{th}$ eigenvalue is excited.

The frequency independent transformation matrix T (and hence frequency independent eigenvectors) allows exploitation of a subtle but important property: the propagation modes remain orthogonal (decoupled) at every frequency if conductors 13–16 are driven with an arbitrary signal containing a spectrum of frequencies. As a result, bandwidth reduction may be achieved by simultaneously propagating all n modes down transmission line 10. The frequency independent eigenvectors prevent "mode conversion" as the frequency components of each signal on conductors 13–16 maintain their modal identity from driver to receiver.

Implementation of the above property is via a symmetric shielded n=4 coupled line having four orthogonal modes of propagation. In the preferred embodiment, since n=4, corresponding to the 4 conductors 13–16, the frequency independent (unnormalized) eigenvectors are $[1, 1, 1, 1]^T$, $[1, -1, 1, -1]^T$, $[1, -1, -1, 1]^T$ and $[1, 1, -1, -1]^T$. For a discussion of matrices, eigenvalues, and eigenvectors, reference may be made to *Matrices and Transformations,* by Anthony J. Pettrofrezzo, ©1966 Dover Publications, Inc., which is incorporated herein by reference, and specifically pp. 83–97.

Figure 3:
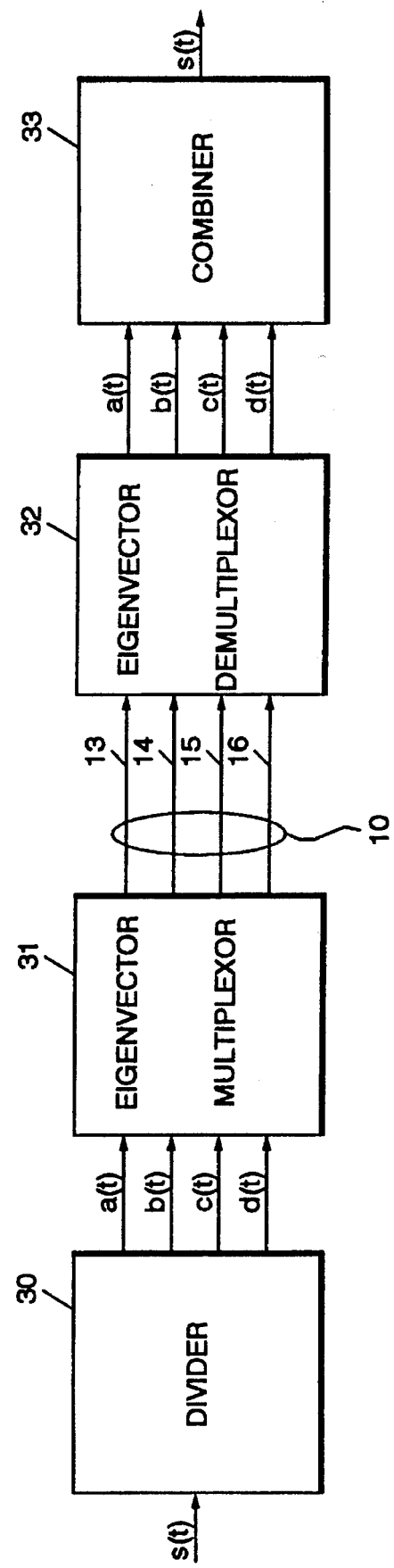
FIG. 3 illustrates a preferred embodiment of the present invention.

Referring next to FIG. 3, there is illustrated an implementation of the present invention using the above discussed techniques. Typically, a high bandwidth (high speed) data signal s(t) with clock period T is desired to be transmitted over transmission line 10. Such a signal may be a 600 Mbit/sec NRZ (nonreturn to zero) data signal. Divider 30 receives signal s(t) and decomposes s(t) into four lower bandwidth signals a(t), b(t), c(t), and d(t) using delay elements T, 2T, 3T, and a clock with period 4T. Thus, the 600 Mbit/sec data signal will be decomposed into four 150 Mbit/sec signals.

Thereafter, a(t), b(t), c(t), and d(t) are sent to eigenvector multiplexor 31 which converts each of these signals into a four element vector signal: a(t) is converted into $A(t)=[A_1(t), A_1(t), A_1(t), A_1(t)]^T$; b(t) is converted into $B(t)=[B_1(t), -B_1(t), B_1(t), -B_1(t)]^T$; c(t) is converted into $C(t)=[C_1(t), -C_1(t), -C_1(t), C_1(t)]^T$; and d(t) is converted into $D(t)=[D_1(t), D_1(t), -D_1(t), -D_1(t)]^T$. This is accomplished by multiplying a(t) with eigenvector $[1, 1, 1, 1]^T$, b(t) by eigenvector $[1, -1, 1, -1]^T$, c(t) by eigenvector $[1, -1, -1, 1]^T$, and d(t) by eigenvector $[1, 1, -1, -1]^T$.

Figure 8:
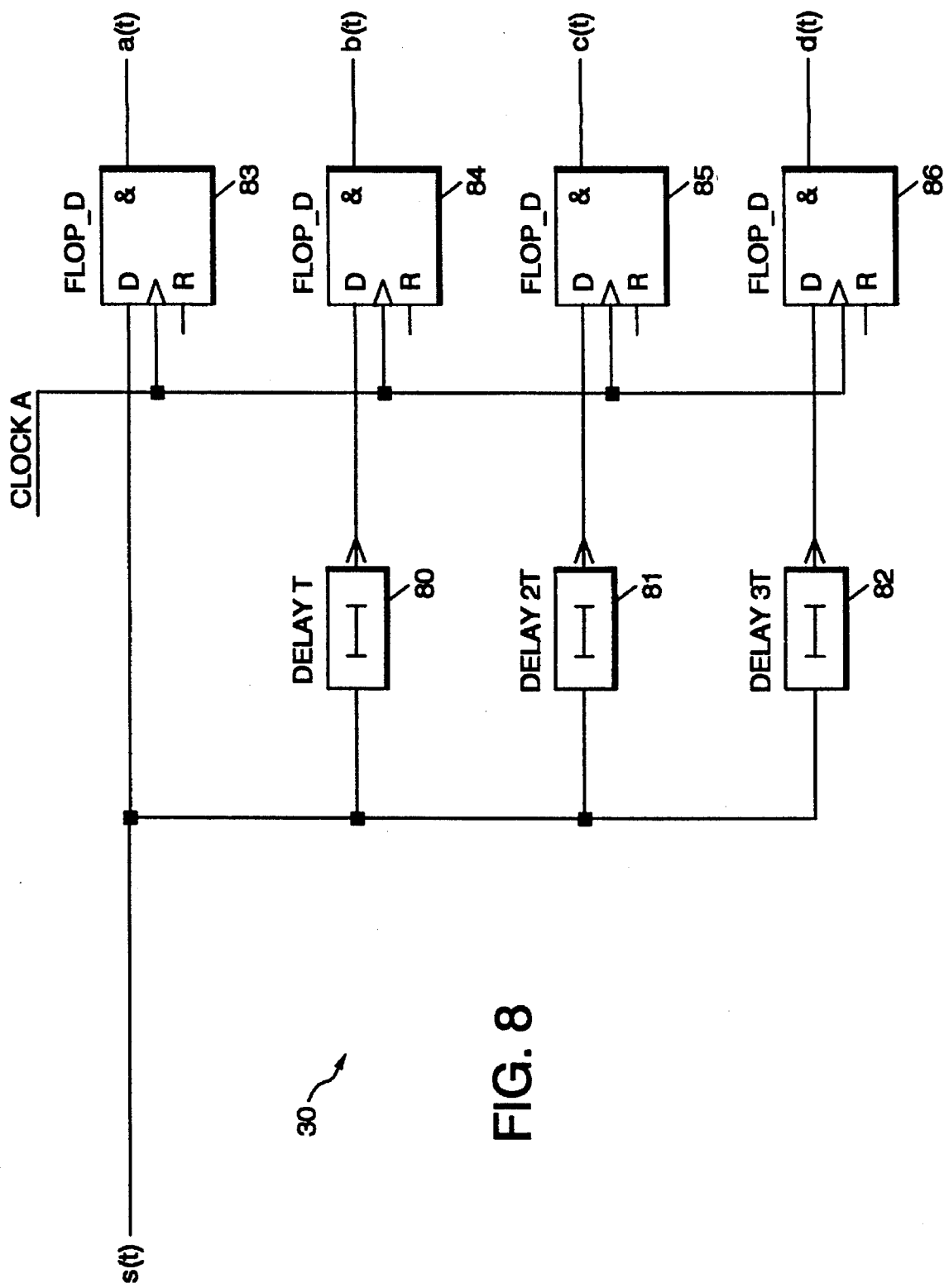
FIG. 8 illustrates a schematic diagram of divider 30.

Referring next to FIG. 8, there is illustrated a schematic diagram of divider 30, which incorporates well known delay circuits 80–82 and D-type flip-flops 83–86.

Figure 9:
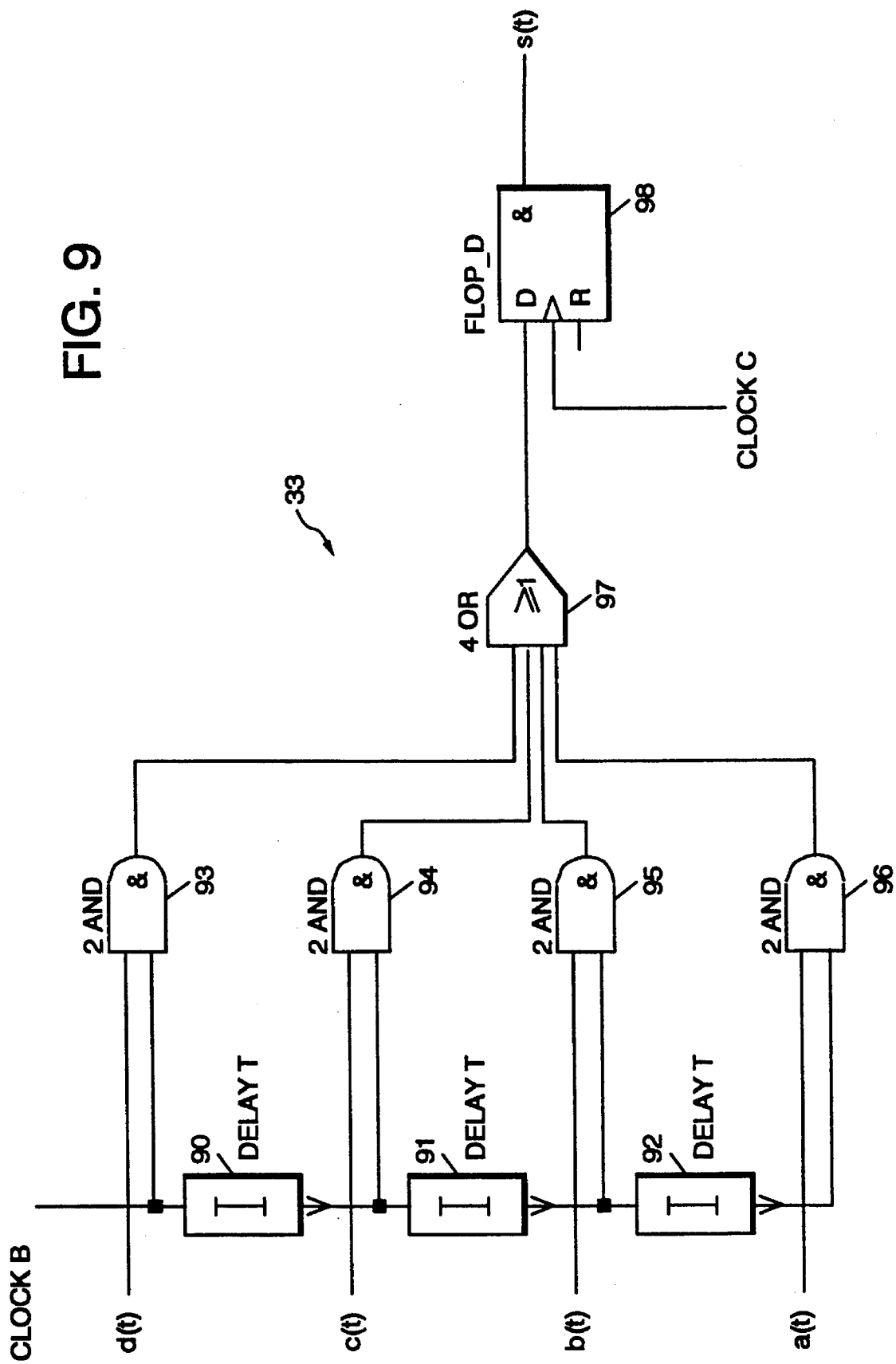
FIG. 9 illustrates a schematic diagram of combiner 33.

Referring next to FIG. 9, there is illustrated a schematic diagram of combiner 33, which incorporates well known delay circuits 90–92, AND logic circuits 93–96, OR logic circuit 97 and flip-flop circuit 98.

Figure 4:
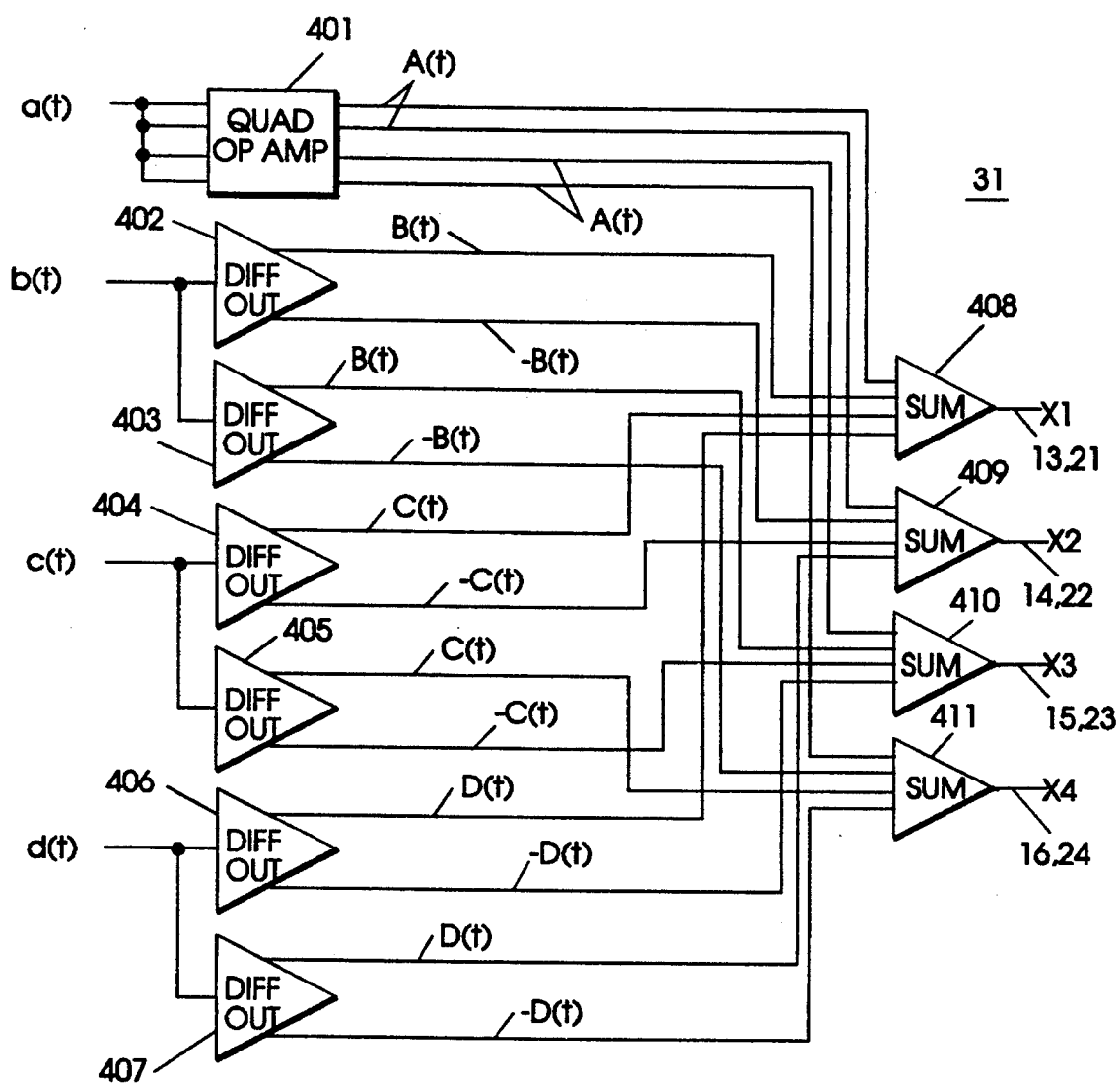
FIG. 4 illustrates a schematic diagram of the eigenvector multiplexor illustrated in FIG. 3.

Referring next to FIG. 4, there is illustrated an implementation of eigenvector multiplexor 31 showing the above conversions. Operational amplifier ("op amp") 401 operates to convert a(t) into vector signal A(t); amplifiers 402 and 403 operate to convert b(t) into B(t); amplifiers 404 and 405 operate to convert c(t) into C(t); and, amplifiers 406 and 407 operate to convert d(t) into D(t). Thereafter, a summing network comprised of summing amplifiers 408–411 sums the above vector signals A(t), B(t), C(t) and D(t) to produce signals $x_1(t)$, $x_2(t)$, $x_3(t)$, and $x_4(t)$. This signal may be represented by $$X(t)=[A^1(t)+B_1(t)+C_1(t)+D_1(t), A_1(t)-B_1(t)-C_1(t)+D_1(t), A_1(t)+B_1(t)-C_1(t)-D_1(t), A_1(t)-B_1(t)+C_1(t)-D_1(t)]^T$$

which is generated and used to drive conductors 13–16 within transmission line 10.

Figure 5:
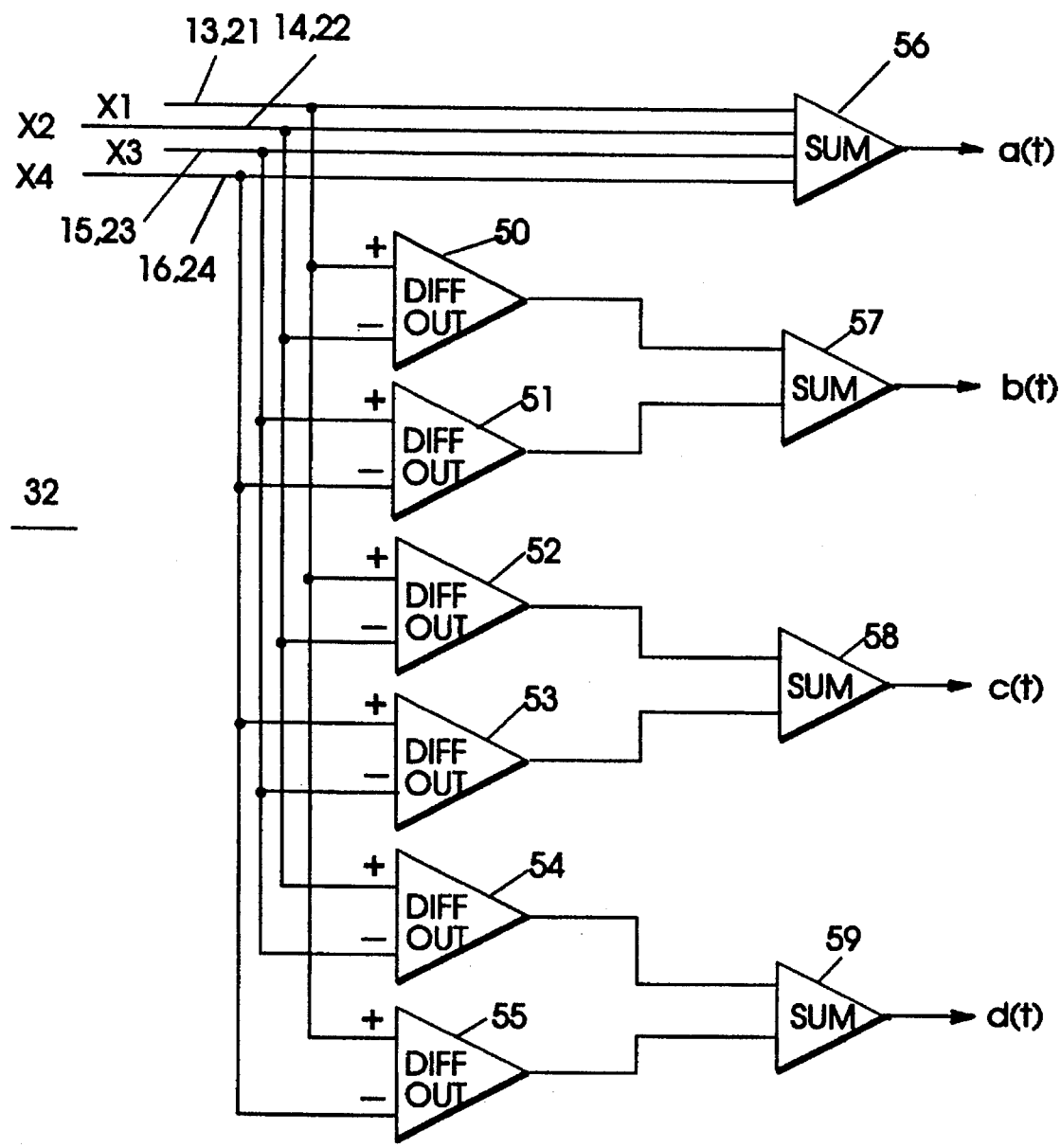
FIG. 5 illustrates a schematic diagram of the eigenvector demultiplexor illustrated in FIG. 3.

Referring back to FIG. 3, after signal X(t) is transmitted over conductors 13–16, it is received by eigenvector demultiplexor 32, which reconstructs signals a(t), b(t), c(t) and d(t) as further illustrated in FIG. 5. Eigenvector demultiplexor 32 utilizes differential amplifiers 50–55 and summing amplifiers 56–59 to reconstruct signals a(t), b(t), c(t) and d(t) from X(t).

Symbolically, the aforementioned reconstruction may be referred to as follows, using the notation that $x_i$ is the $i^{th}$ component of the vector X(t):

a(t): $x_1+x_2+x_3+x_4$ b(t): $x_1-x_2+x_3-x_4$ c(t): $x_1-x_2-x_3+x_4$ d(t): $x_1+x_2-x_3-x_4$

Referring back to FIG. 3, combiner 33 receives signals a(t), b(t), c(t) and d(t) to recombine the signals into signal s(t) in a manner that is the reverse of the operation utilized within divider 30. Note that it is well known in the art to perform the operations within divider 30 and combiner 33.

Note that the various amplifiers discussed above are commonly available and well known in the art.

Figure 6:
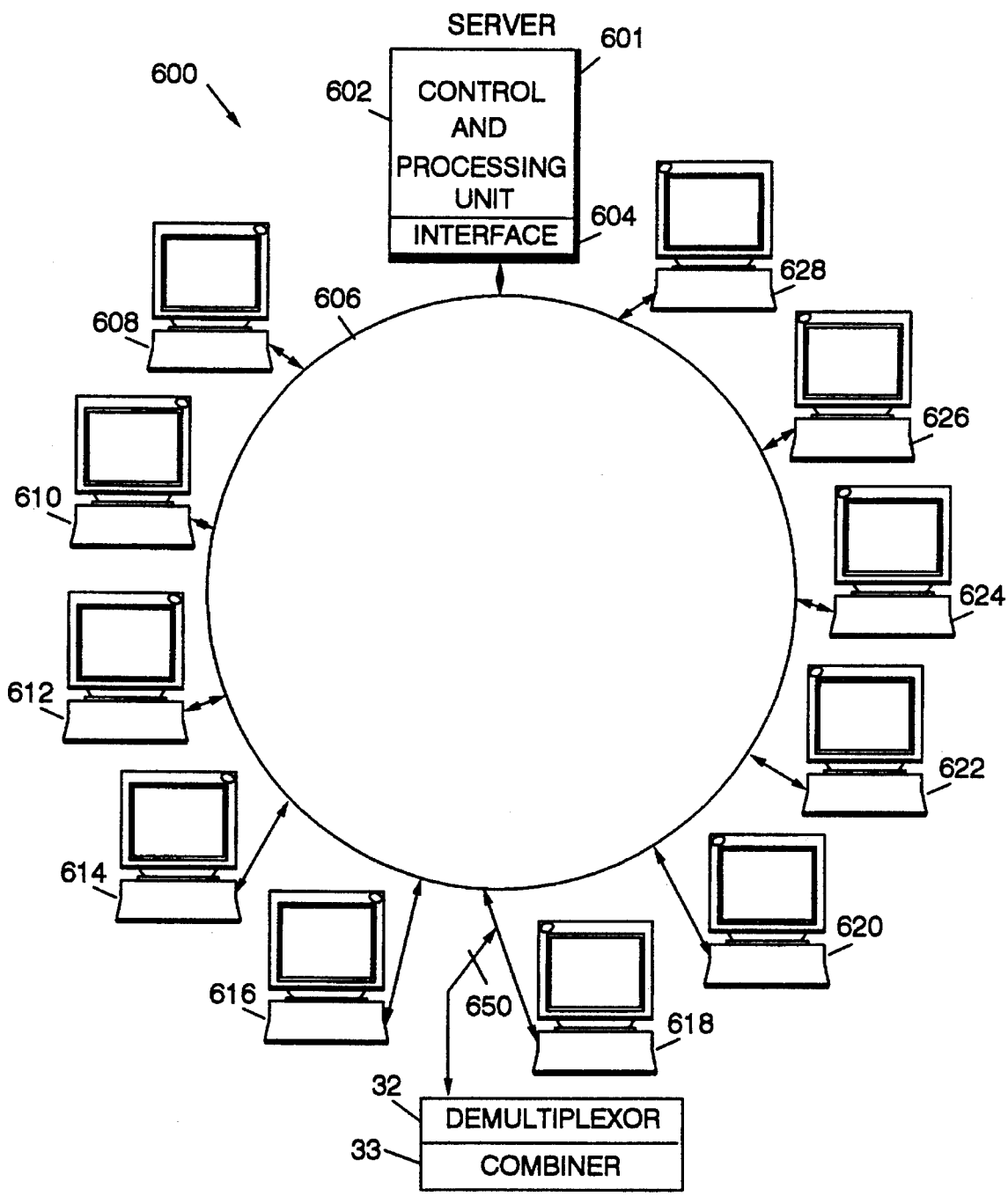
FIG. 6 illustrates a network data processing system utilizing the present invention.

Referring now to FIG. 6, data processing system 600 having server 601 and a number of requesting devices connected via network 606 will be described. Network 606 may contain and utilize transmission line 10, 20 to assist in connecting the various devices within network 606. Server 601 has control and processing unit 602 and interface unit 604 both of which will be described in more detail below. Server 601 is connected through interface unit 604 to one or more networks such as 606 which may be local area networks, wide area networks, or nationwide or international data transmission networks or the like. Stations 608, 610, 612, 614, 616, 618, 620, 622, 624, 626, 628 are representative of stations which may be connected to network 606 or other networks which may have a need to raise a request for access to system resources through server 602 and interface unit 604.

Figure 7:
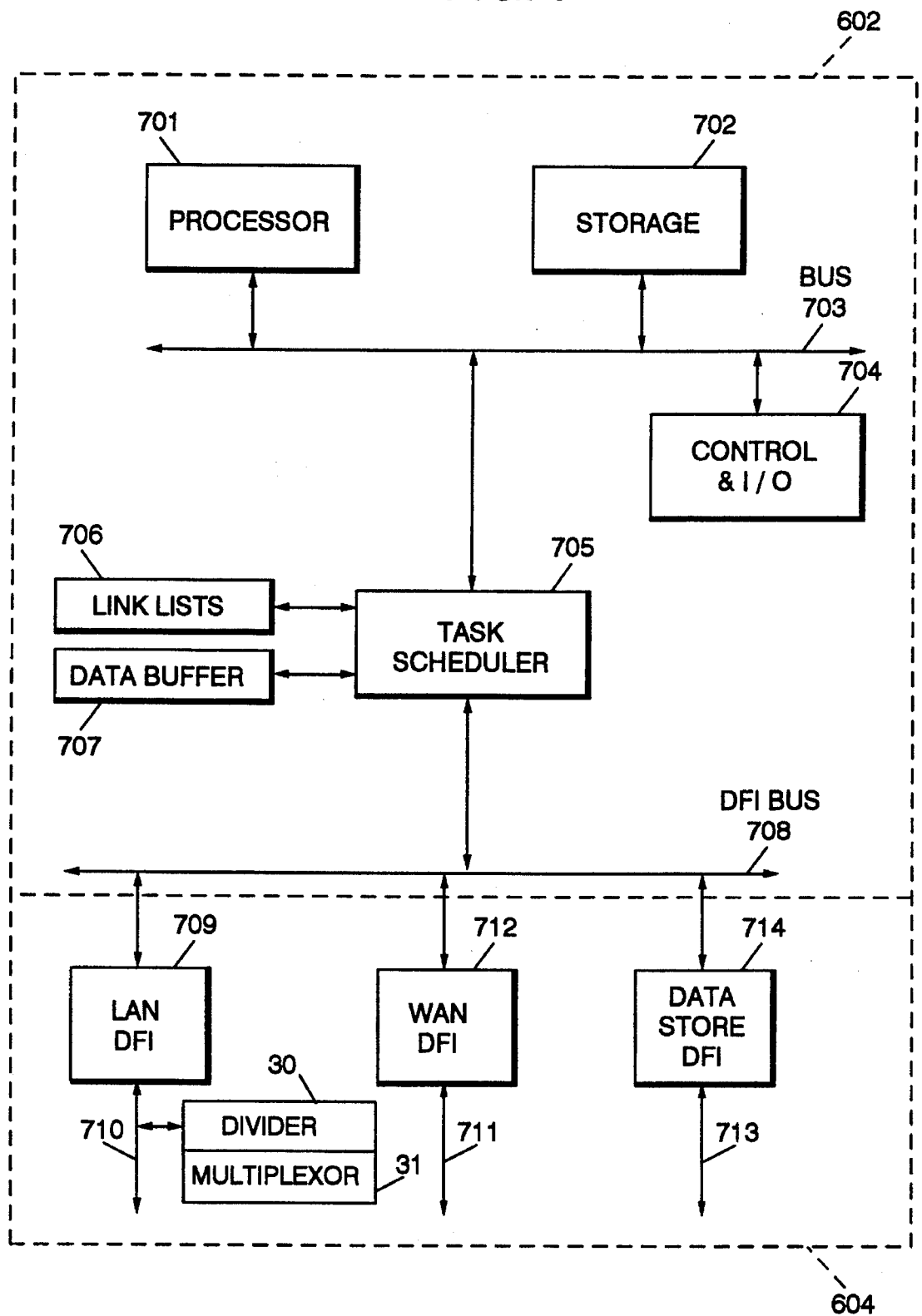
FIG. 7 illustrates a detailed block diagram of the server of the network illustrated in FIG. 6.

Referring now to FIG. 7, server 601 will be described in further detail.

Control and processing unit 602 includes processor 701, storage unit 702, processor subsystem bus 703, local control and input/output unit 704 such as might be required for communicating with devices such as printers, keyboards, displays, and the like, and task scheduler 705. Processor 701, storage unit 702, and local control and input/output unit 704 connected to processor system bus 703 perform the usual functions of control, processing, storage and input/output which are commonly done by those elements in a Von Neumann computer architecture system. Task scheduler 705 controls the grant of requests for access to system resources and manages data buffers. Information regarding requests for access is stored in link list 706 and associated data is stored in data buffer 707. Both link list 706 and data buffer 707 operate under the control of task scheduler 705. Task scheduler 705 controls the flow of data on data flow interface bus 708 which connects control and processing unit 602 to network interface unit 604.

Network interface unit 604 includes a number of data flow interface units such as local area network interface unit 709, wide area network interface unit 712, and data storage interface unit 714. Local area network (LAN) data flow interface unit 709 is connected to a network such as 606 by lines 710. Wide area network (WAN) data flow interface unit 712 is connected to a network (not shown) by lines 711 and data flow interface 714 is connected to a data storage network (not shown) by lines 713.

An example of the implementation of the present invention within system 600 is illustrated in FIGS. 6 and 7. Divider 30 and multiplexor 31 may be coupled to lines 710 so that high bandwidth data from LAN interface unit 709 may be manipulated as described above for transmission over network 606 (containing line 10, 20) to device 618. The encoded data is first received by demultiplexor 32 and combiner 33 via bus 650 before being given to device 618 in its original high bandwidth format.

Although the present invention and its advantages have been described in detail, it should be understood that various changes, substitutions and alterations can be made herein without departing from the spirit and scope of the invention as defined by the appended claims.

What is claimed is:

1. A method for transporting a high bandwidth signal over N electrically conducting transmission lines to a receiving terminal, wherein N>1, said method comprising the steps of:

subdividing said signal into N sub-signals, wherein each of said N sub-signals has a bandwidth less than said high bandwidth signal;

encoding said N sub-signals to have N orthogonal modes of propagation;

transmitting said encoded N sub-signals over said N transmission lines to said receiving terminal;

decoding said transmitted encoded N sub-signals into said N sub-signals; and recombining said decoded N sub-signals to form said signal at said receiving terminal.

2. The method as recited in claim 1 wherein said N electrically conducting transmission lines are arranged in cyclic symmetry with each other.

3. The method as recited in claim 1 wherein said N electrically conducting transmission lines are N parallel bus lines arranged over a ground plane, wherein distances between adjacent bus lines are equal.

4. The method as recited in claim 2 wherein said encoding step includes the step of:

multiplying said N sub-signals by eigenvectors associated with propagation characteristics of said transmission lines, wherein said eigenvectors are frequency independent as a result of said cyclic symmetry.

5. The method as recited in claim 2 wherein said encoding step includes the steps of:

determining a propagation matrix associated with said cyclicly arranged transmission lines;

determining eigenvalues associated with said propagation matrix;

determining eigenvectors for each of said eigenvalues; and multiplying said N sub-signals by said eigenvectors to produce said N modes of propagation.

6. The method as recited in claim 2 wherein said transmitting step includes the step of:

driving said N transmission lines with voltages corresponding to said N modes of propagation.

7. A system for alleviating modal conversion between electrical conductors during transmission of a signal, wherein said conductors exhibit symmetrical propagation characteristics, said system comprising:

means for implementing delay factors into said signal in order to decompose said signal into a set of sub-signals;

means for encoding each of said sub-signals with a set of parameters so that each said sub-signal propagates in a frequency independent mode; and means for driving said conductors with said encoded sub-signals.

8. The system as recited in claim 7, further comprising:

means for reconstructing said signal from said encoded sub-signals.

9. The system as recited in claim 7 wherein said electrical conductors are arranged in cyclic symmetry with each other.

10. The system as recited in claim 7 wherein said electrical conductors are parallel bus lines arranged over a ground plane, wherein distances between adjacent bus lines are equal.

11. The system as recited in claim 7 wherein said encoding means includes a plurality of operational amplifiers receiving said sub-signals.

12. The system as recited in claim 8 wherein said reconstructing means includes a plurality of differential amplifiers receiving said encoded sub-signals.

13. The system as recited in claim 9 wherein said encoding means further comprises:

means for determining a propagation matrix associated with said cyclicly arranged conductors;

means for determining eigenvalues associated with said propagation matrix;

means for determining eigenvectors for each of said eigenvalues; and means for multiplying said sub-signals by said eigenvectors to propagate said frequency independent modes.

14. A method for transmitting a high-speed data signal over N electrically conducting transmission lines, wherein said N transmission lines are physically arranged in relation to each other so as to present a selected set of impedance and admittance characteristics to a signal propagating over said lines, wherein N>1, said method comprising the steps of:

dividing said data signal into N sub-signals each having a data rate lower than said high-speed data signal;

encoding said N sub-signals with a set of parameters designated to propagate said N sub-signals over said N transmission lines in N frequency independent modes; and driving said N transmission lines with said encoded sub-signals.

15. The method as recited in claim 14 wherein centers of said N transmission lines are equidistant from each other and lie on a circle whose center is the same as a center of an outer ground shield enclosing said N transmission lines.

16. The method as recited in claim 15 wherein said dividing step further comprises the step of:

subjecting said high-speed data signal to a set of delays and clocking to produce said N sub-signals.

17. The method as recited in claim 15 wherein said encoding step further comprises the steps of:

determining a propagation matrix associated with said N transmission lines;

determining eigenvalues associated with said propagation matrix;

determining eigenvectors for each of said eigenvalues;

multiplying said N sub-signals by said eigenvectors to produce N vector signals, each of said N vector signals incorporating one of said N modes of propagation; and combining said vector signals to produce N summed signals.

18. A data communications network comprising:

a processor for processing tasks;

a memory, for storing control information and data, associated with said processor;

a data bus for communicating data from said processor or said memory to one or more data interface units;

one or more data interface units for communicating control and data signals between said data bus and a plurality of devices requesting access to said processor or said memory; and a system for transmitting a high-speed data signal over N electrically conducting transmission lines between said one or more data interface units and at least one of said plurality of devices, wherein said N transmission lines are physically arranged in relation to each other so as to present a selected set of impedance and admittance characteristics to a signal propagating over said lines, wherein N>1, said system comprising:

means for dividing said data signal into N sub-signals each having a data rate lower than said high-speed data signal;

means for determining a propagation matrix associated with said N transmission lines;

means for determining eigenvalues associated with said propagation matrix;

means for determining eigenvectors for each of said eigenvalues;

means for multiplying said N sub-signals by said eigenvectors to produce N vector signals, each of said N vector signals incorporating one of said N modes of propagation;

means for combining said vector signals to produce N summed signals; and means for driving said N transmission lines with said encoded sub-signals.

19. A system adapted for receiving and decoding a plurality of sub-signals propagating in frequency independent modes over N electrically conducting transmission lines, wherein said sub-signals represent a high-speed data signal, and wherein said N transmission lines are physically arranged in relation to each other so as to present a selected set of impedance and admittance characteristics to a signal propagating over said lines, wherein N>1, said system comprising:

means for combining said sub-signals, received from said N transmission lines, in selected combinations to produce N low-speed data signals; and means for multiplexing said N low-speed data signals into said high-speed data signal.

20. The system as recited in claim 19 wherein centers of said N transmission lines are equidistant from each other and lie on a circle whose center is the same as a center of an outer ground shield enclosing said N transmission lines.

21. A system for transporting a high bandwidth signal over N electrically conducting transmission lines to a receiving terminal, wherein N>1, said system comprising:

means for subdividing said signal into N sub-signals, wherein each of said N sub-signals has a bandwidth less than said high bandwidth signal;

means for encoding said N sub-signals to have N orthogonal modes of propagation;

means for transmitting said encoded N sub-signals over said N transmission lines to said receiving terminal;

means for decoding said transmitted encoded N sub-signals into said N sub-signals; and means for recombining said decoded N sub-signals to form said signal at said receiving terminal.

22. The system as recited in claim 21 wherein said N electrically conducting transmission lines are arranged in cyclic symmetry with each other.

23. The system as recited in claim 21 wherein said N electrically conducting transmission lines are N parallel bus lines arranged over a ground plane, wherein distances between adjacent bus lines are equal.

24. The system as recited in claim 22 wherein said encoding means includes:

means for multiplying said N sub-signals by eigenvectors associated with propagation characteristics of said transmission lines, wherein said eigenvectors are frequency independent as a result of said cyclic symmetry.

25. The system as recited in claim 22 wherein said encoding means includes:

means for determining a propagation matrix associated with said cyclicly arranged transmission lines;

means for determining eigenvalues associated with said propagation matrix;

means for determining eigenvectors for each of said eigenvalues; and means for multiplying said N sub-signals by said eigenvectors to produce said N modes of propagation.

26. The system as recited in claim 22 wherein said transmitting means includes:

means for driving said N transmission lines with voltages corresponding to said N modes of propagation.

27. A system adapted for transmitting a high-speed data signal over N electrically conducting transmission lines, wherein said N transmission lines are physically arranged in relation to each other so as to present a selected set of impedance and admittance characteristics to a signal propagating over said lines, wherein N>1, said system comprising:

means for dividing said data signal into N sub-signals each having a data rate lower than said high-speed data signal;

means for determining a propagation matrix associated with said N transmission lines;

means for determining eigenvalues associated with said propagation matrix;

means for determining eigenvectors for each of said eigenvalues;

means for multiplying said N sub-signals by said eigenvectors to produce N vector signals, each said vector signal incorporating one of said N modes of propagation;

means for combining said vector signals to produce N summed signals; and means for driving said N transmission lines with said encoded sub-signals.

* * * * *